United States Patent
Kim et al.

(10) Patent No.: US 9,558,941 B2
(45) Date of Patent: Jan. 31, 2017

(54) METHOD OF FORMING OXIDE THIN FILM AND METHOD OF FABRICATING OXIDE THIN FILM TRANSISTOR USING HYDROGEN PEROXIDE

(71) Applicant: Industry-Academic Corporation Foundation, Yonsei University, Seoul (KR)

(72) Inventors: Hyun Jae Kim, Seoul (KR); Jeong Moo Kwon, Chungcheongnam-do (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/244,230

(22) Filed: Apr. 3, 2014

(65) Prior Publication Data

US 2015/0011045 A1 Jan. 8, 2015

(30) Foreign Application Priority Data

Jul. 5, 2013 (KR) .................. 10-2013-0079125

(51) Int. Cl.
*H01L 29/786* (2006.01)
*H01L 29/12* (2006.01)
(Continued)

(52) U.S. Cl.
CPC ... *H01L 21/02554* (2013.01); *H01L 21/02565* (2013.01); *H01L 21/02628* (2013.01);
(Continued)

(58) Field of Classification Search
CPC ...... H01L 21/36; H01L 21/336; H01L 21/441; H01L 21/8238
(Continued)

(56) References Cited

U.S. PATENT DOCUMENTS

2004/0265587 A1* 12/2004 Koyanagi et al. ............ 428/398
2006/0060857 A1* 3/2006 Mardilovich et al. ......... 257/66
(Continued)

FOREIGN PATENT DOCUMENTS

JP 2002146536 A 5/2002
JP 2004256313 A 9/2004
(Continued)

OTHER PUBLICATIONS

D. Vasanth Raj,etal.,Effect of annealing and electrochemical properties of sol-gel dipcoated nanocrystalline V2O5 thin films, Materials Science in Semiconductor Processing (2012), http://dx.doi.org/10.1016/j.mssp.2012.11.001.*
(Continued)

*Primary Examiner* — Kimberly Rizkallah
*Assistant Examiner* — Brian Turner
(74) *Attorney, Agent, or Firm* — Carter, DeLuca, Farrell & Schmidt, LLP

(57) ABSTRACT

Provided are a method of forming an oxide thin film using hydrogen peroxide, and a method of fabricating an oxide thin film transistor using hydrogen peroxide. Embodiments of the present disclosure provide methods of forming an oxide film, including: mixing hydrogen peroxide with a precursor solution in which a precursor material is dissolved in a solvent; applying the precursor solution mixed with the hydrogen peroxide to a substrate; heat treating the substrate.

18 Claims, 13 Drawing Sheets

(51) Int. Cl.
*H01L 29/04* (2006.01)
*H01L 21/336* (2006.01)
*H01L 21/441* (2006.01)
*H01L 21/02* (2006.01)
*H01L 29/66* (2006.01)

(52) U.S. Cl.
CPC .... *H01L 29/66969* (2013.01); *H01L 29/7869* (2013.01); *H01L 29/78696* (2013.01)

(58) Field of Classification Search
USPC ......... 438/104; 427/58, 126; 257/43, E21.09
See application file for complete search history.

(56) References Cited

U.S. PATENT DOCUMENTS

| | | | | |
|---|---|---|---|---|
| 2008/0023698 A1* | 1/2008 | Li et al. | ............................ | 257/43 |
| 2009/0140243 A1* | 6/2009 | Kim et al. | ...................... | 257/43 |
| 2009/0173938 A1* | 7/2009 | Honda et al. | ................... | 257/43 |
| 2010/0320457 A1* | 12/2010 | Matsubara et al. | ............ | 257/43 |
| 2011/0233539 A1* | 9/2011 | Seon | ................... | H01L 31/1884 |
| | | | | 257/43 |
| 2013/0217180 A1* | 8/2013 | Facchetti | ............ | C23C 18/1216 |
| | | | | 438/104 |
| 2013/0295507 A1* | 11/2013 | Keszler | .................. | C01G 25/02 |
| | | | | 430/270.1 |

FOREIGN PATENT DOCUMENTS

| | | |
|---|---|---|
| KR | 1020070004168 A | 1/2007 |
| KR | 1020100045811 A | 5/2010 |
| KR | 1020120077788 A | 7/2012 |
| KR | 1020130025703 A | 3/2013 |

OTHER PUBLICATIONS

Gougousi et al., "Metal Oxide Thin Films Deposited from Metal Organic Precursors in Supercritical CO2 Solutions", Chem. Mater. 2005, 17, 5093-5100.*

* cited by examiner

FIG. 15
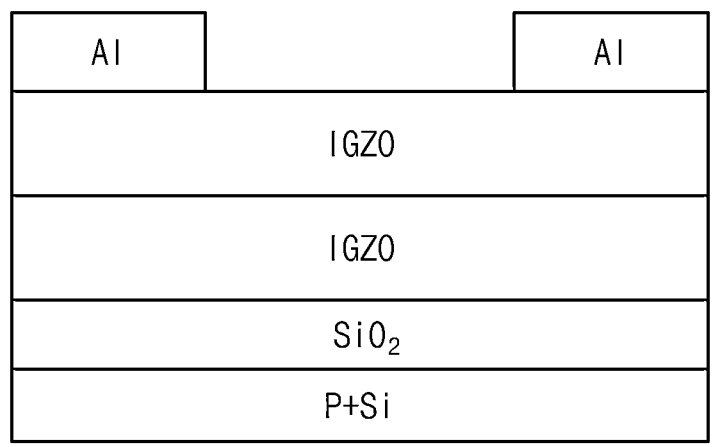
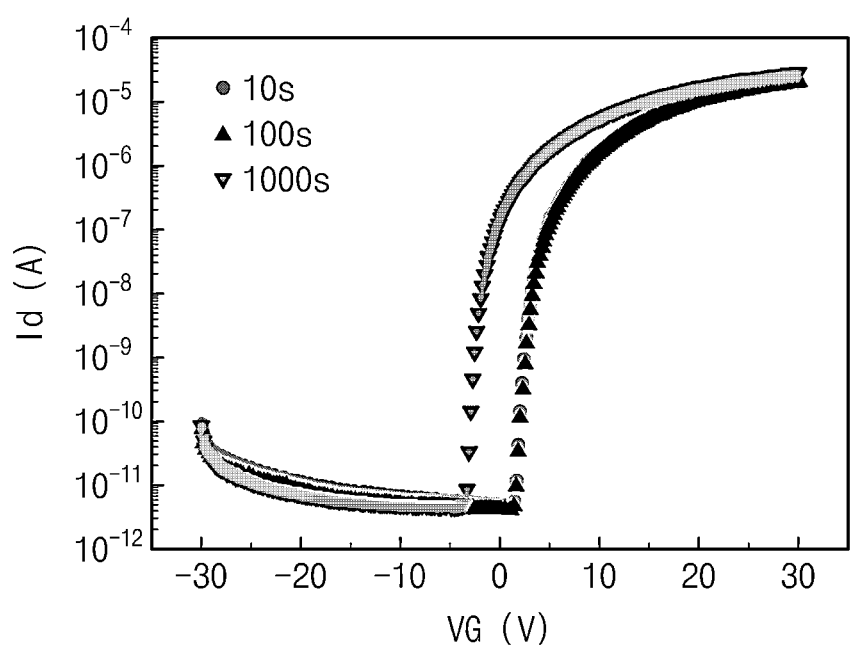

FIG. 16
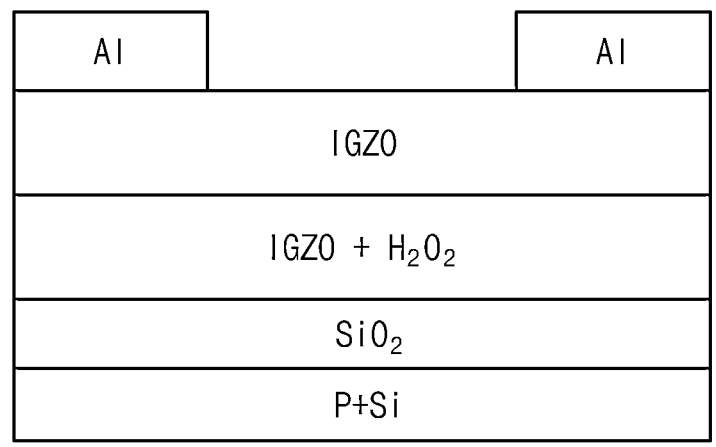
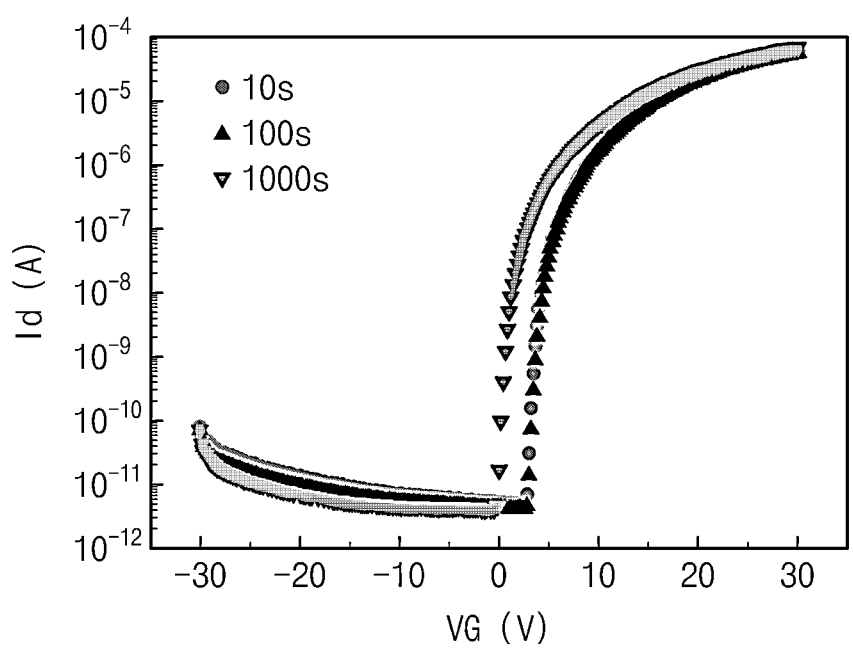

FIG. 17
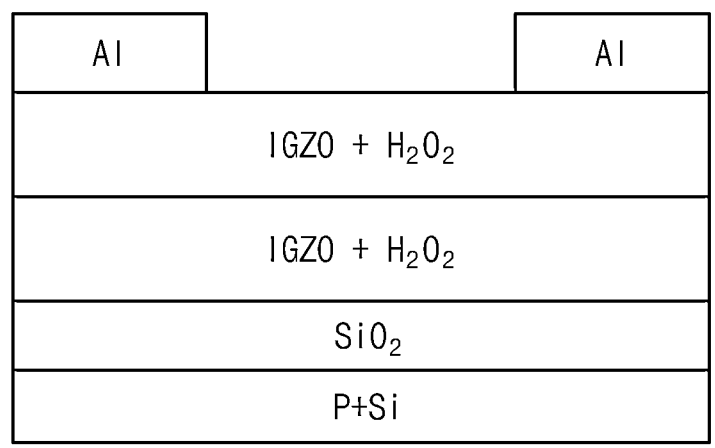
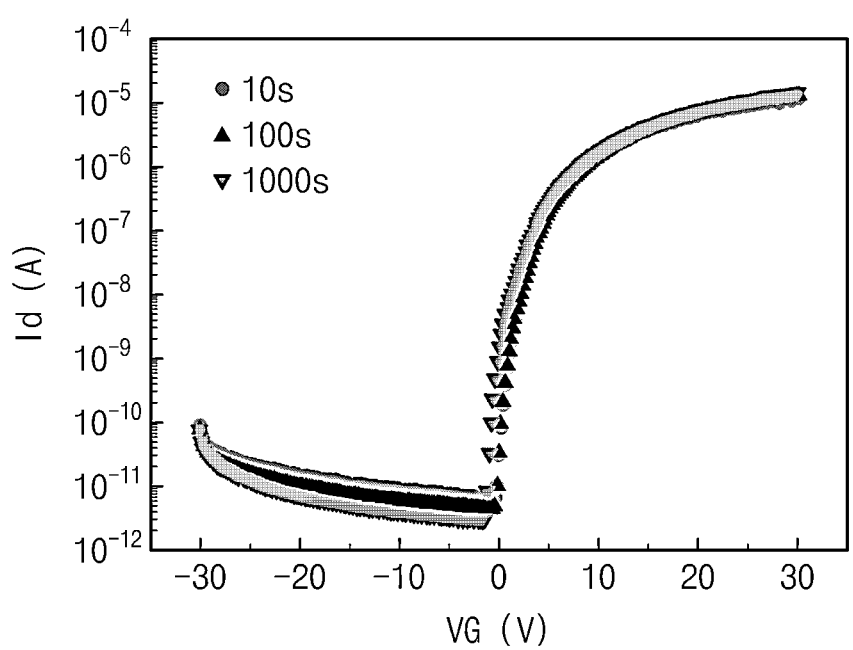

METHOD OF FORMING OXIDE THIN FILM AND METHOD OF FABRICATING OXIDE THIN FILM TRANSISTOR USING HYDROGEN PEROXIDE

CROSS-REFERENCE TO RELATED APPLICATIONS

This U.S. non-provisional patent application claims priority under 35 U.S.C. §119 of Korean Patent Application No. 10-2013-0079125, filed on Jul. 5, 2013, the disclosure of which is hereby incorporated by reference in its entirety.

BACKGROUND OF THE INVENTION

The subject matter disclosed herein relates to methods of forming an oxide thin film and fabricating an oxide thin film transistor by using hydrogen peroxide.

An a-Si:H-based thin film transistor is used as a switching element for a display panel. However, the a-Si:H-based thin film transistor has drawbacks in that mobility and transmittance are low and production costs are high. To this end, an oxide thin film transistor that can achieve high mobility, high transmittance and cost reduction has come to prominence as a next generation switching element.

Such an oxide thin film transistor may be fabricated by using a vacuum evaporation, a printing technique, a solution process, or the like. Among these, the solution process has been introduced as a simplified process technique that may overcome the vacuum evaporation having high cost and low productivity.

However, since the solution process has a high defect occurrence rate in a thin film due to the use of an organic material as an assistant material, the solution process has drawbacks in that electrical performance and operation reliability are reduced. In order to improve the quality and reliability of a thin film, various techniques, such as a heat treatment using ozone, a heat treatment using vacuum, irradiation of ultra violet rays, and the like have been studied, but these techniques have drawbacks in that post-process costs increase and productivity is reduced.

SUMMARY OF THE INVENTION

The subject matter disclosed herein provides a method of forming an oxide thin film and a method of fabricating an oxide thin film transistor by which a high quality thin film having less defects may be formed at low costs and an oxide thin film transistor having superior electrical performances may be fabricated.

Embodiments of the present disclosure provide methods of forming an oxide film, comprising: mixing hydrogen peroxide with a precursor solution in which a precursor material is dissolved in a solvent; applying the precursor solution mixed with the hydrogen peroxide to a substrate; heat treating the substrate.

In some embodiments, the precursor material may comprise at least one selected from the group consisting of an indium compound, a gallium compound, a zinc compound, a tin compound, a zirconium compound, an aluminum compound, a neodymium compound, a tantalum compound, a titanium compound, a barium compound, a lanthanum compound, a manganese compound, a chromium compound, a strontium compound, an yttrium compound, and a cerium compound.

In other embodiments, the solvent may comprise at least one selected from the group consisting of 2-methoxyethanol, isopropanol, dimethylformamide, ethanol, deionized water, methanol, acetylacetone, dimethylamineborane, and acetonitrile.

In still other embodiments, the above method may, prior to mixing hydrogen peroxide with the precursor solution, further comprise adding to the precursor solution at least one selected from the group consisting of an acetic acid ($CH_3COOH$), a nitric acid ($HNO_3$), mono-ethanolamine, di-ethanolamine, tri-ethanolamine, acetylacetonate, ethylenediamine, tetramethlyethylendiamine, ethylene glycol ($C_2H_6O_2$), and glycerol ($C_3H_8O_3$).

In even other embodiments, the mixing of hydrogen peroxide with the precursor solution may comprise mixing hydrogen peroxide and the precursor solution at a molar ratio of 1:0.1~1.

In yet other embodiments, the applying of the precursor solution mixed with hydrogen peroxide to a substrate may comprise, before the hydrogen peroxide reacts with the precursor solution to form a precipitate, applying the precursor solution mixed with hydrogen peroxide to the substrate.

In further embodiments, the heat treating the substrate may comprise heat treating the substrate at a first temperature and heat treating the substrate at a second temperature higher than the first temperature.

In still further embodiments, the heat treating the substrate at a first temperature may comprise heat treating the substrate at 100° C. for 30 minutes.

In still further embodiments, the heat treating the substrate at a second temperature may comprise heat treating the substrate at 450° C. for 2 hours.

In even further embodiments, the above method may, prior to the heat treating the substrate at 450° C. for 2 hours and after heat treating the substrate at 100° C. for 30 minutes, further comprise heat treating the substrate at 300° C. for 5 minutes.

Embodiments of the present disclosure provide methods of fabricating an oxide thin film transistor comprising: mixing hydrogen peroxide with a precursor solution in which a precursor material is dissolved in a solvent; forming a channel layer by applying the precursor solution mixed with the hydrogen peroxide to a substrate provided with a gate and a gate insulating layer, and heat treating the substrate; and forming a source and a drain in the substrate.

In some embodiments, the precursor solution may be prepared by dissolving indium nitrate hydrate, gallium nitrate hydrate and zinc acetate dihydrate in 2-methoxyethanol.

In still other embodiments, the indium nitrate hydrate, the gallium nitrate hydrate and the zinc acetate dihydrous may have a molar ratio of 5:1:2.

In even other embodiments, the solvent and the precursor material may have a molar ratio of 1:0.3.

In even other embodiments, the above method may, prior to mixing hydrogen peroxide with the precursor solution, further comprise adding mono-ethanol amine and an acetic acid to the precursor solution.

In yet other embodiments, applying the precursor solution mixed with the hydrogen peroxide on a substrate may comprise applying the precursor solution mixed with the hydrogen peroxide to the substrate within one hour after mixing the hydrogen peroxide with the precursor solution.

In further embodiments, the heat treating the substrate may comprise heat treating the substrate at 100° C. for 30 minutes to activate the hydrogen peroxide.

In even further embodiments, the heat treating the substrate may comprise: heat treating the substrate at 300° C.

for 5 minutes to change the precursor solution to a gel state after the activating of the hydrogen peroxide; and heat treating the substrate at 450° C. for 2 hours.

In yet further embodiments, the forming a channel layer may comprise: (a) applying the precursor solution mixed with the hydrogen peroxide to the substrate; (b) heat treating the substrate at 100° C. for 30 minutes to activate the hydrogen peroxide; (c) heat treating the substrate at 300° C. for 5 minutes to change the precursor solution to a gel state; (d) repeating (a)~(c); and (e) heat treating the substrate at 450° C. for 2 hours.

In some embodiments, the forming a channel layer may comprise: applying the precursor solution mixed with the hydrogen peroxide to the substrate; heat treating the substrate at 100° C. for 30 minutes to activate the hydrogen peroxide; heat treating the substrate at 300° C. for 5 minutes to change the precursor solution to a gel state; applying the precursor solution to the substrate; heat treating the substrate at 100° C. for 30 minutes to change the precursor solution to a gel state; and heat treating the substrate at 450° C. for 2 hours.

In other embodiments, the above method may further include forming a passivation layer on the channel layer.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings:

FIGS. 15 through 17 show combinations of cross-sectional views and voltage-current characteristic graphs of an oxide thin film transistor having two channel layers formed by using a precursor solution in which hydrogen peroxide is not mixed, an oxide thin film transistor having a lowermost layer formed by using a precursor solution in which hydrogen peroxide is mixed, and an uppermost layer formed by using a precursor solution in which hydrogen peroxide is not mixed, and an oxide thin film transistor having two channel layers formed by using a precursor solution in which hydrogen peroxide is mixed.

DETAILED DESCRIPTION OF PREFERRED EMBODIMENTS

Other advantages and features of the present disclosure, and implementation methods thereof will be clarified through following embodiments described with reference to the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. Further, the present disclosure is only defined by scopes of claims.

Though not defined, all terms (including technical or scientific terms) used herein have the same meanings as those generally accepted by universal technologies in the related art to which the present disclosure pertains. The terms defined by general dictionaries may be construed as having the same meanings as those in the related art and/or the text of the present disclosure, and will not be construed as being conceptualized or excessively formal although the terms are not clearly defined expressions herein.

In the following description, the technical terms are used only for explaining exemplary embodiments while not limiting the present disclosure. The terms of a singular form may include plural forms unless otherwise specified. The meaning of 'include', 'comprise', 'including', or 'comprising', specifies a property, a region, a fixed number, a step, a process, an element and/or a component but does not exclude other properties, regions, fixed numbers, steps, processes, elements and/or components. The term "and/or" used herein includes any and all combinations of one or more of the associated listed items.

According to the embodiments of the present disclosure, an oxide thin film with high quality can be obtained at a low cost by using hydrogen peroxide, and an oxide thin film transistor having high operation performances and high operation reliabilities can be fabricated.

Hereinafter, exemplary embodiments of the present disclosure will be described with reference to the accompanying drawings.

Figure 1:
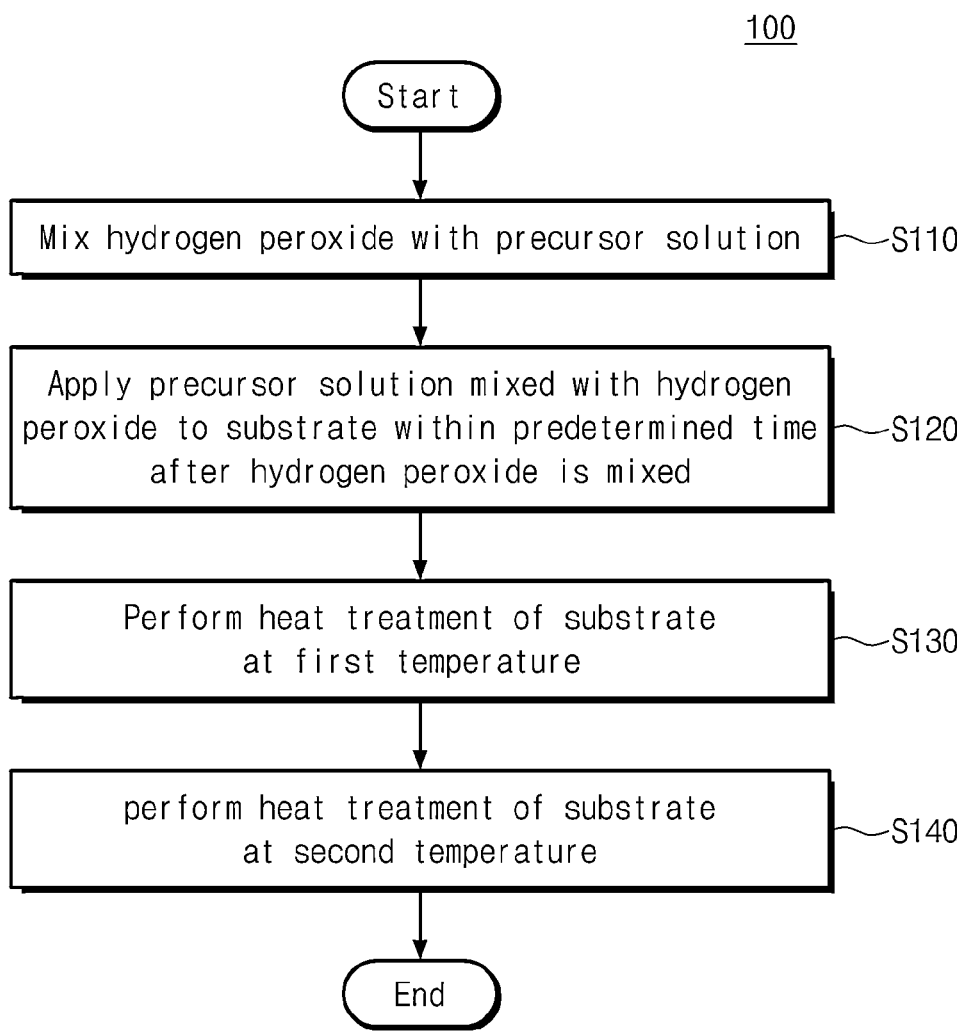
FIG. 1 is an exemplary flow diagram explaining a method of forming an oxide thin film according to an exemplary embodiment of the present disclosure.

FIG. 1 is an exemplary flow diagram explaining a method of forming an oxide thin film according to an exemplary embodiment of the present disclosure.

As shown in FIG. 1, a method 100 of forming an oxide thin film may comprise mixing hydrogen peroxide in a precursor solution (S110), applying the precursor solution in which hydrogen peroxide is mixed to a substrate within a predetermined time after the hydrogen peroxide is mixed (S120), heat treating the substrate at a first temperature (S130), and heat treating the substrate at a second temperature (S140).

The precursor solution may be prepared by dissolving a precursor material of a metal constituting the oxide thin film in a solvent. In some embodiments, the precursor material may include at least one selected from the group consisting of an indium compound, a gallium compound, a zinc compound, a tin compound, a zirconium compound, an aluminum compound, a neodymium compound, a tantalum compound, a titanium compound, a barium compound, a lanthanum compound, a manganese compound, a chromium compound, a strontium compound, an yttrium compound, and a cerium compound, but the present disclosure is not limited thereto.

The indium compound may include at least one selected from the group consisting of indium chloride, indium chloride tetrahydrate, indium fluoride, indium fluoride trihydrate, indium hydroxide, indium nitrate hydrate, indium acetate hydrate, indium acetylacetonate, and indium acetate, but the present disclosure is not limited thereto.

The gallium compound may include at least one selected from the group consisting of gallium nitrate, gallium phosphide, gallium(II) chloride, gallium(III) acetylacetonate, gallium(III) bromide, gallium(III) chloride, gallium(III) fluoride, gallium(III) iodide, gallium(III) nitrate hydrate, gallium(III) sulfate, and gallium(III) sulfate hydrate, but the present disclosure is not limited thereto.

The zinc compound may include at least one selected from the group consisting of zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, and zinc perchlorate hexa hydrate, but the present disclosure is not limited thereto.

The tin compound may include at least one selected from the group consisting of tin(II) chloride, tin(II) iodide, tin(II) chloride dehydrate, tin(II) bromide, tin(II) fluoride, tin(II) oxalate, tin(II) sulfide, tin(II) acetate, tin(IV) chloride, tin(IV) chloride pentahydrate, tin(IV) fluoride, tin(IV) iodide, tin(IV) sulfide, and tin(IV) tert-butoxide, but the present disclosure is not limited thereto.

The zirconium compound may include at least one selected from the group consisting of zirconium acetate, zirconium nitrate, zirconium(II) hydride, zirconium(IV) acetate hydroxide, zirconium(IV) acetylacetonate, zirconium(IV) butoxide solution, zirconium(IV) carbide, zirconium (IV) chloride, zirconium(IV) ethoxide, zirconium(IV) fluoride, zirconium(IV) fluoride hydrate, zirconium(IV) hydroxide, zirconium(IV) iodide, zirconium(IV) sulfate hydrate, and zirconium(IV) tert-butoxide, but the present disclosure is not limited thereto.

The aluminum compound may include at least one selected from the group consisting of aluminum acetate, aluminum acetylacetonate, aluminum borate, aluminum bromide, aluminum carbide, aluminum chloride, aluminum chloride hexahydrate, aluminum chloride hydrate, aluminum ethoxide, aluminum fluoride, aluminum hydroxide hydrate, aluminum iodide, aluminum isopropoxide, aluminum nitrate nonahydrate, aluminum nitride, aluminum phosphate, aluminum sulfate, aluminum sulfate hexadecahydrate, aluminum sulfate hydrate, and aluminum tert-butoxide, but the present disclosure is not limited thereto.

The neodymium compound may include at least one selected from the group consisting of neodymium(II) iodide, neodymium(III) acetate hydrate, neodymium(III) acetylacetonate hydrate, neodymium(III) bromide, neodymium(III) bromide hydrate, neodymium(III) carbonate hydrate, neodymium(III) chloride, neodymium(III) chloride hexahydrate, neodymium(III) fluoride, neodymium(III) hydroxide hydrate, neodymium(III) iodide, neodymium(III) isopropoxide, neodymium(III) nitrate hexahydrate, neodymium(III) nitride hydrate, neodymium(III) oxalate hydrate, neodymium(III) phosphate hydrate, neodymium(III) sulfate, and neodymium(III) sulfate hydrate, but the present disclosure is not limited thereto.

The tantalum compound may include at least one selected from the group consisting of tantalum bromide, tantalum chloride, and tantalum fluoride, but the present disclosure is not limited thereto.

The titanium compound may include at least one selected from the group consisting of titanium bromide, titanium chloride, and titanium fluoride, but the present disclosure is not limited thereto.

The barium compound may include at least one selected from the group consisting of barium acetate, barium acetylacetonate, barium bromide, barium chloride, barium fluoride, barium hexafluoroacetylacetonate, barium hydroxide, and barium nitrate, but the present disclosure is not limited thereto.

The lanthanum compound may include at least one selected from the group consisting of lanthanum acetate, lanthanum acetylacetonate, lanthanum bromide, lanthanum chloride, lanthanum hydroxide, lanthanum fluoride, and lanthanum nitrate, but the present disclosure is not limited thereto.

The manganese compound may include at least one selected from the group consisting of manganese acetate, manganese acetylacetonate, manganese bromide, manganese chloride, manganese fluoride, and manganese nitrate, but the present disclosure is not limited thereto.

The chromium compound may include at least one selected from the group consisting of chromium acetate, chromium acetylacetonate, chromium bromide, chromium chloride, chromium fluoride, and chromium nitrate, but the present disclosure is not limited thereto.

The strontium compound may include at least one selected from the group consisting of strontium acetate, strontium acetylacetonate, strontium bromide, strontium chloride, strontium fluoride, strontium hydroxide, and strontium nitrate, but the present disclosure is not limited thereto.

The yttrium compound may include at least one selected from the group consisting of yttrium acetate, yttrium acetylacetonate, yttrium chloride, yttrium fluoride, and yttrium nitrate, but the present disclosure is not limited thereto.

The cerium compound may include at least one selected from the group consisting of cerium(III) acetate hydrate, cerium(III) acetylacetonate hydrate, cerium(III) bromide, cerium(III) carbonate hydrate, cerium(III) chloride, cerium (III) chloride heptahydrate, cerium(III) fluoride, cerium(III) iodide, cerium(III) nitrate hexahydrate, cerium(III) oxalate hydrate, cerium(III) sulfate, cerium(III) sulfate hydrate, cerium(III) sulfate octahydrate, cerium(IV) fluoride, cerium(IV) hydroxide, cerium(IV) sulfate, cerium(IV) sulfate hydrate, and cerium(IV) sulfate tetrahydrate, but the present disclosure is not limited thereto.

The solvent may include at least one selected from the group consisting of 2-methoxyethanol, isopropanol, dimethylformamide, ethanol, deionized water, methanol, acetylacetone, dimethylaminoborane, and acetonitrile, but the present disclosure is not limited thereto.

In an embodiment, the method 100 of forming an oxide thin film may further comprise, prior to mixing (S110) hydrogen peroxide with the precursor solution, adding a stabilizer to the precursor solution.

The stabilizer may include at least one selected from the group consisting of an acetic acid ($CH_3COOH$), a nitric acid ($HNO_3$), mono-ethanol amine, di-ethanolamine, tri-ethanol amine, acetylacetonate, ethylenediamine, tetramethlyethylendiamine, ethylene glycol ($C_2H_6O_2$), and glycerol ($C_3H_8O_3$), but the present disclosure is not limited thereto.

In an embodiment, the mixing (S110) of hydrogen with the precursor solution may include mixing hydrogen peroxide and the precursor solution at a molar ratio of 1:0.1~1.

The precursor solution mixed with hydrogen peroxide may be applied to a substrate within a predetermined time after the hydrogen peroxide is mixed. This is to prevent precipitation due to a reaction between hydrogen peroxide and the precursor solution. In an embodiment, the precursor solution mixed with the hydrogen peroxide may be applied to the substrate within 1 hour after mixing.

In heat treating (S130) at a first temperature, the first temperature may be set to a temperature to activate the hydrogen peroxide mixed with the precursor solution. In an embodiment, the heat treating (S130) the substrate at a first temperature may include heat treating the substrate at about 100° C. for 30 minutes, but the first temperature may be lower than 100° C.

The heat treating (S140) the substrate at a second temperature is to evaporate the solvent from the precursor solution to form an oxide thin film.

In one embodiment, the heat treating (S140) the substrate at a second temperature may include heat treating the substrate at 450° C. for 2 hours.

In another embodiment, the method 100 of forming an oxide thin film may further include, prior to heat treating (S140) the substrate at a second temperature, heat treating the substrate at a third temperature lower than the second temperature. For example, the method 100 of forming an oxide thin film may further include, prior to heat treating the substrate at 450° C. for 2 hours, heat treating the substrate at 300° C. for 5 minutes.

Figure 2:
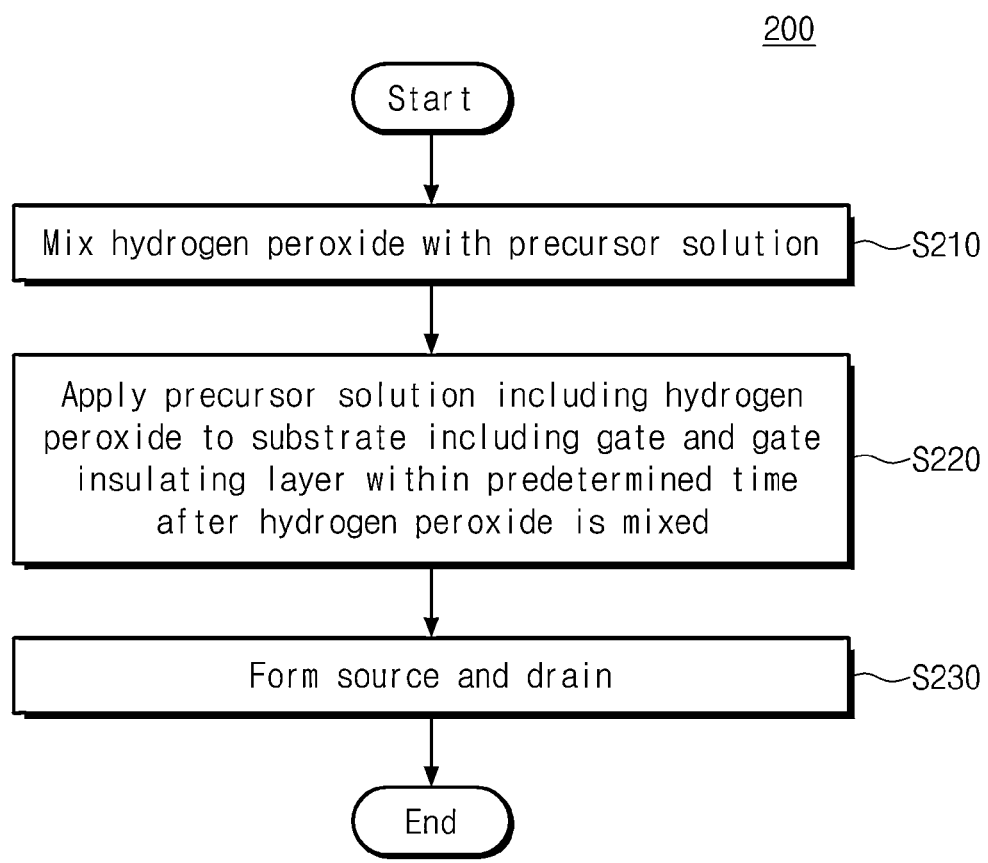
FIG. 2 is an exemplary flow diagram explaining an oxide thin film transistor according to an exemplary embodiment of the present disclosure.
Figure 3:
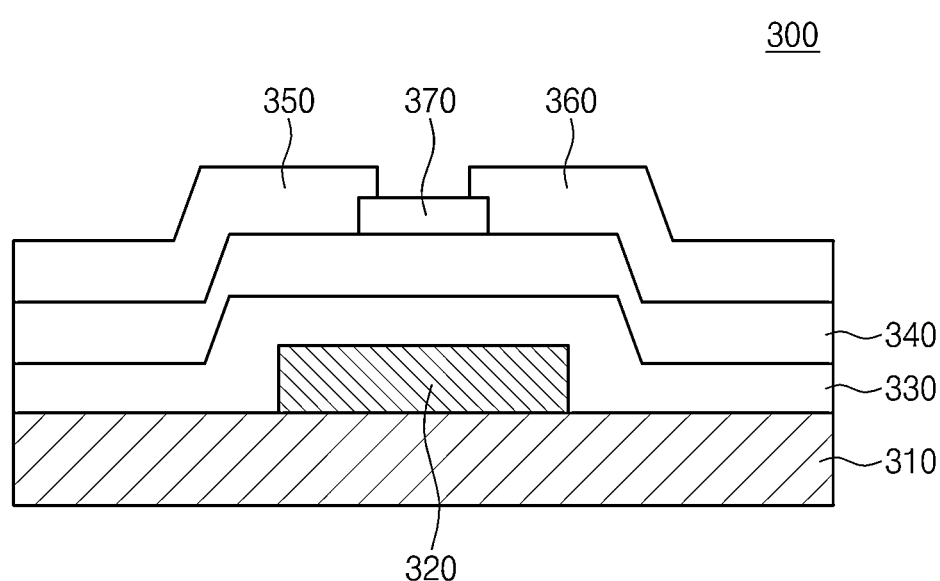
FIG. 3 is an exemplary cross-sectional view of an oxide thin film transistor fabricated according to an embodiment of the present disclosure.

FIG. 2 is an exemplary flow diagram explaining an oxide thin film transistor according to an exemplary embodiment of the present disclosure, and FIG. 3 is an exemplary cross-sectional view of an oxide thin film transistor fabricated according to an embodiment of the present disclosure.

Referring to FIGS. 2 and 3, a method 200 of fabricating an oxide thin film transistor may include mixing (S210) hydrogen peroxide with a precursor solution, forming a channel layer 340 by applying (S220) the precursor solution mixed with the hydrogen peroxide to a substrate 310 provided with a gate 320 and a gate insulating layer 330, within a predetermined time after the hydrogen peroxide is mixed, and heat treating the substrate, and forming (S230) a source 350 and a drain 360 in the substrate 310.

In one embodiment, the channel layer 340 may be an oxide thin film based on indium, gallium, or zinc. In this case, the precursor solution may be prepared by dissolving indium nitrate hydrate, gallium nitrate hydrate and zinc acetate dihydrate in a solvent. The solvent may be 2-methoxyethanol.

In one embodiment, the indium nitrate hydrate, gallium nitrate hydrate and zinc acetate dihydrate may be dissolved in a molar ratio of 5:1:2 in the precursor solution, but the present disclosure is not limited thereto.

Also, the molar ratio between the solvent and the solute may be 1:0.3, but the present disclosure is not limited thereto.

In an embodiment, the method 200 of fabricating an oxide thin film transistor may further comprise, prior to mixing (S210) hydrogen peroxide with a precursor solution, adding mono-ethanolamine to the precursor solution as a stabilizer in order to prevent agglomeration and precipitation of the precursor solution.

In an embodiment, the method 200 of fabricating an oxide thin film transistor may further comprise, prior to mixing (S210) hydrogen peroxide with a precursor solution, adding an acetic acid to the precursor solution in order to improve solubility and reactivity.

The precursor solution mixed with hydrogen peroxide may be applied to the substrate before the hydrogen peroxide reacts with the precursor solution to generate precipitates. For example, the precursor solution mixed with the hydrogen peroxide may be applied to the substrate within 1 hour after the hydrogen peroxide is mixed with the precursor solution.

In an embodiment, forming (S220) the channel layer 340 may comprise heat treating the substrate at 100° C. for 30 minutes to activate the hydrogen peroxide.

Also, forming (S220) the channel layer may, after heating the substrate to activate the hydrogen peroxide, comprise heating the substrate at 300° C. for 5 minutes to change the precursor solution to a gel state, and heating the substrate at 450° C. for 2 hours to increase the density of the thin film.

While the above embodiments show and describe that one channel layer is formed by using the precursor solution mixed with hydrogen peroxide, two or more channel layers may be formed in a stack type in other embodiments.

For example, the forming (S220) the channel layer may include (a) applying the precursor solution mixed with hydrogen peroxide to a substrate, (b) heat treating the substrate at a first temperature to activate the hydrogen peroxide, (c) heat treating the substrate at a second temperature which may be higher than the first temperature to change the precursor solution to a gel state, (d) repeating (a)~(c) by the target number of channel layer, and (e) heat treating the substrate at a third temperature which is lower than the second temperature to form an oxide thin film.

In an embodiment, the precursor solution mixed with hydrogen peroxide may be used to form only a portion (for example, the lowermost layer) among a plurality of stacked layers, and a precursor solution which is not mixed with hydrogen peroxide may be used to form a remaining portion among the plurality of stacked layers.

For example, the forming (S220) the channel layer may comprise applying the precursor solution mixed with hydrogen peroxide to a substrate, heat treating the substrate at a first temperature to activate the hydrogen peroxide, heat treating the substrate at a second temperature to change the precursor solution to a gel state, applying a precursor solution which is not mixed with hydrogen peroxide to the substrate, heat treating the substrate at the second temperature to change the precursor solution to a gel state, and heat treating the substrate to form an oxide thin film.

The forming (S230) the source and the drain may comprise depositing a source 340 and a drain 360 using a sputtering. The source 340 and the drain 360 may be formed of a metal such as an aluminum.

In an embodiment, the method 200 may further include forming a passivation layer 370 over the channel layer 340.

Hereinafter, embodiments of a method of fabricating an oxide thin film transistor using hydrogen peroxide will be described.

Figure 4:
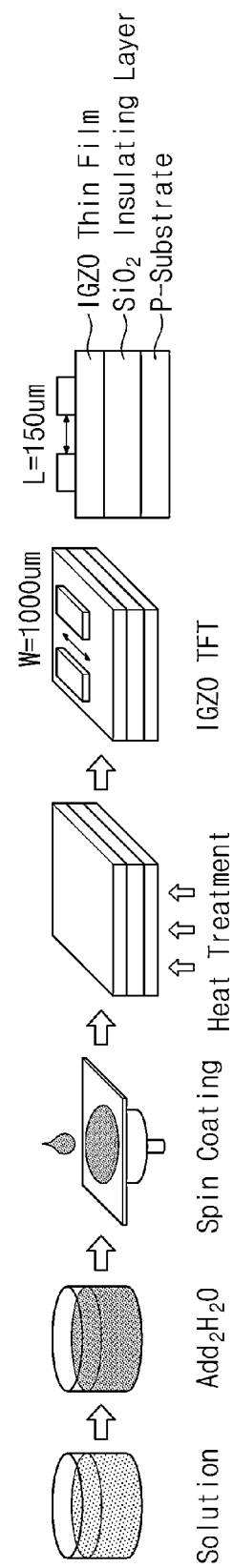
FIG. 4 is a schematic view illustrating a solution process for fabricating an oxide thin film transistor using hydrogen peroxide according to an embodiment of the present disclosure.

FIG. 4 is a schematic view illustrating a solution process for fabricating an oxide thin film transistor using hydrogen peroxide according to an embodiment of the present disclosure.

As illustrated in FIG. 4, a transistor having an indium gallium zinc oxide (IGZO) thin film was fabricated by a solution process using hydrogen peroxide. Indium nitrate hydrate, gallium nitrate hydrate and zinc acetate dihydrate were selected as start materials and were then dissolved in 2-methoxyethanol at a molar ratio of 5:1:2. At this time, the ratio of solute to solvent was 0.3. Also, monoethanolamine was added as a stabilizer in the solution in order to prevent occurrence of agglomeration and precipitation, and an acetic acid was added to improve the solubility and reactivity.

The prepared solution was stirred with a magnetic bar at 350 rpm for 1 hour on a hot plate set to 70° C. Then, the solution was filtered through a 0.2 μm filter to remove impurities. The solution finally obtained was left for 24 hours to secure the stability of the solution.

Then, 30% hydrogen peroxide was added to the solution by the same ratio as the ratio of metal to solvent. That is, the molar ratio of 30% hydrogen peroxide to solvent was 0.3 and the hydrogen peroxide used in this embodiment was 0.08 mole. The solution in which hydrogen peroxide was added was applied to a substrate within 1 hour after mixing.

The prepared substrate was a P-type silicon substrate in which boron was heavily doped, and a silicon dioxide ($SiO_2$) layer was formed to a thickness of about 120 nm on the substrate.

Before being used, the substrate was cleaned by ultrasonic cleaning using acetone and methanol for 30 minutes, and then dipped in a NaOH solution for 30 minutes for hydrophilic surface treatment.

Then, the substrate was washed with deionized (DI)-water, and contaminants on the substrate were removed by using $N_2$.

The precursor solution mixed with hydrogen peroxide was applied to the substrate pretreated as above by using a syringe. A spin coating was conducted so as to uniformly distribute the mixture solution applied on the substrate to a desired thickness. The spin coating was conducted in five steps in a sequence of 10 seconds at 500 rpm, 15 seconds at 1500 rpm, 25 seconds at 3000 rpm, 15 seconds at 1500 rpm, and 10 seconds at 500 rpm.

Then, heat treatment was conducted at 100° C. for 30 minutes in order to activate hydrogen peroxide, and then heat treatment at 300° C. for 5 minutes and heat treatment at 450° C. for 2 hours were conducted step-by-step in order to increase the density of the thin film.

A source electrode and a drain electrode were formed of aluminum through a sputtering on the thin film formed as above to complete an oxide thin film transistor.

In order to check electrical performances of the oxide thin film transistors fabricated according to the embodiments of the present disclosure, an oxide thin film transistor fabricated with a precursor solution in which hydrogen peroxide was not mixed was also prepared.

Figure 5:
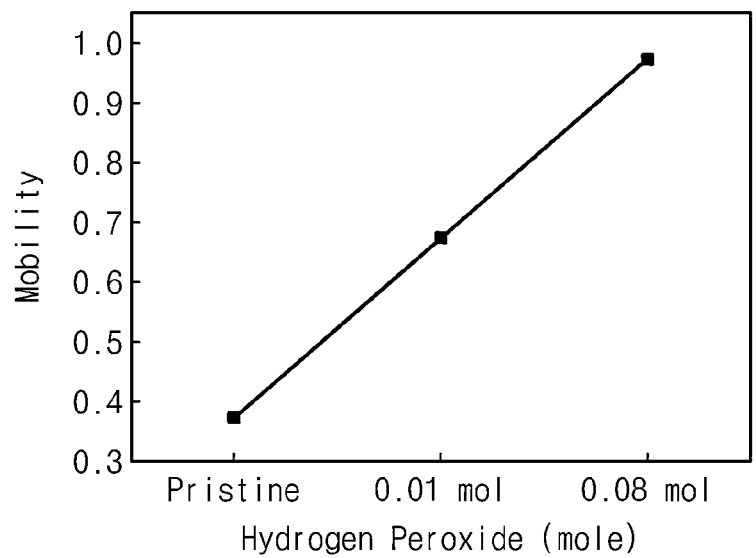
FIGS. 5 through 7 are graphs for comparison of field effect mobility, On-Off current ratio and subthreshold swing between an oxide thin film transistor fabricated without using hydrogen peroxide and an oxide thin film transistor fabricated using hydrogen peroxide.
Figure 6:
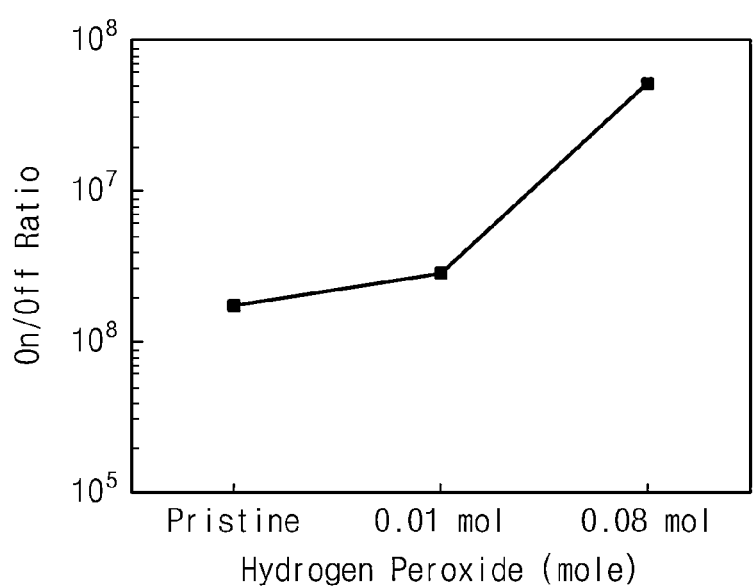
Figure 7:
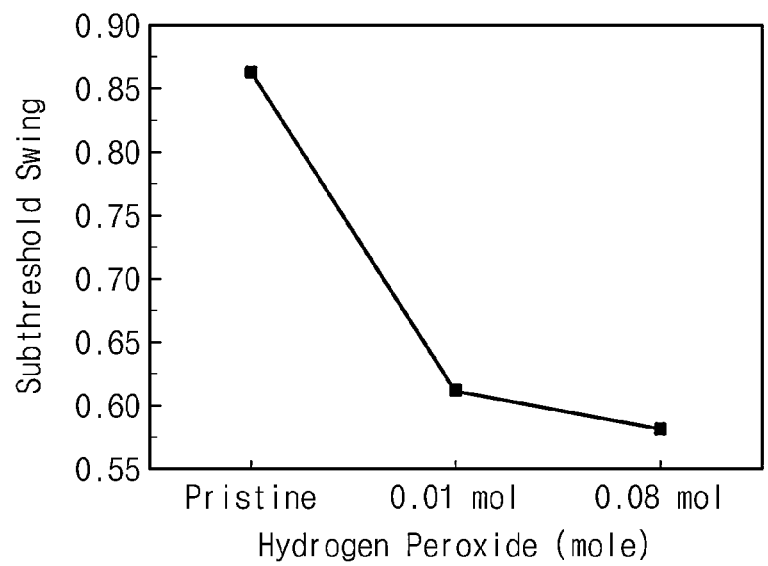

FIGS. 5 through 7 are graphs for comparison of field effect mobility, On-Off current ratio and subthreshold swing between an oxide thin film transistor fabricated without using hydrogen peroxide and an oxide thin film transistor fabricated using hydrogen peroxide.

Referring to FIGS. 5 through 7, compared with the oxide thin film transistor fabricated without using hydrogen peroxide, in the case of the oxide thin film transistor fabricated by mixing 0.08 mole of hydrogen peroxide, the field effect mobility was improved from 0.37 $cm^2/V_s$ to 0.97 $cm^2/V_s$, On-Off current ratio was improved from $1.17 \times 10^6$ to $5.17 \times 10^6$, and subthreshold swing was improved from 0.86 V/dec to 0.57 V/dec.

Figure 8:
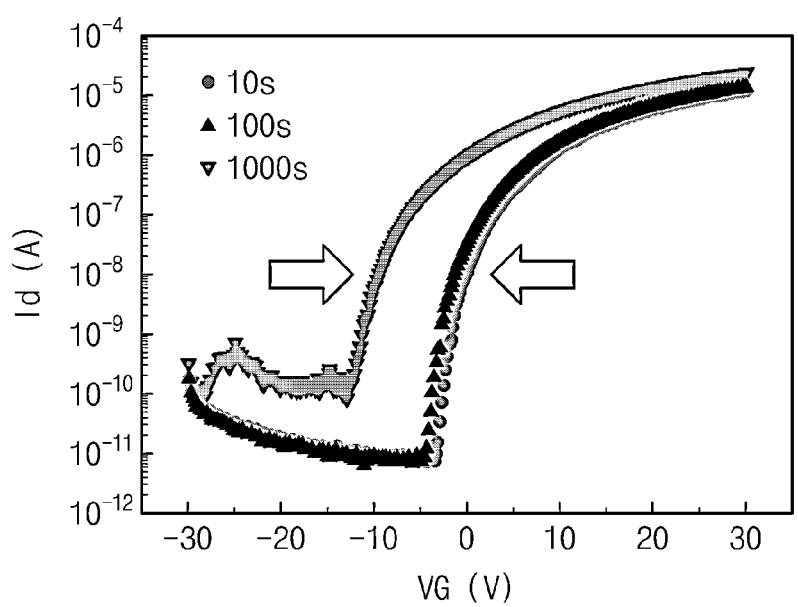
FIGS. 8 through 10 are graphs showing voltage-current characteristics of a transistor fabricated without using hydrogen peroxide, a transistor fabricated by mixing 0.01 mole of hydrogen peroxide, and a transistor fabricated by mixing 0.08 mole of hydrogen peroxide, respectively.
Figure 9:
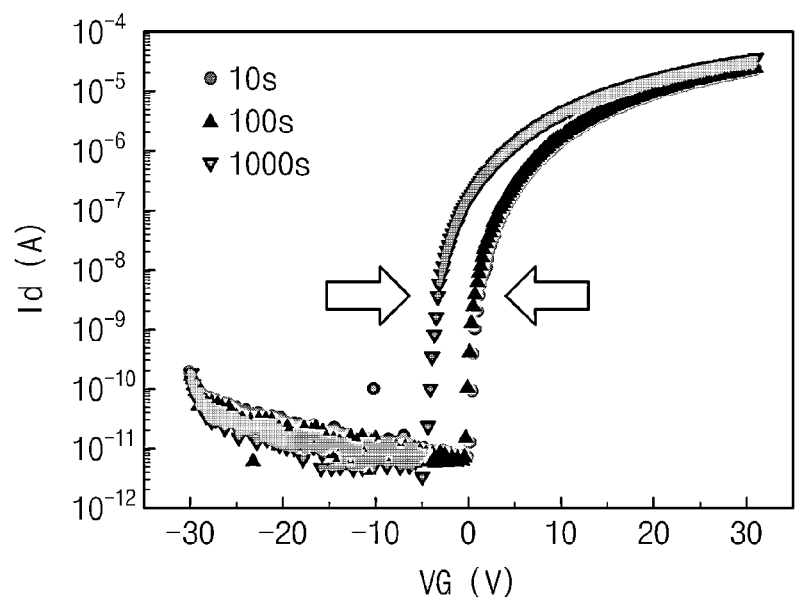
Figure 10:
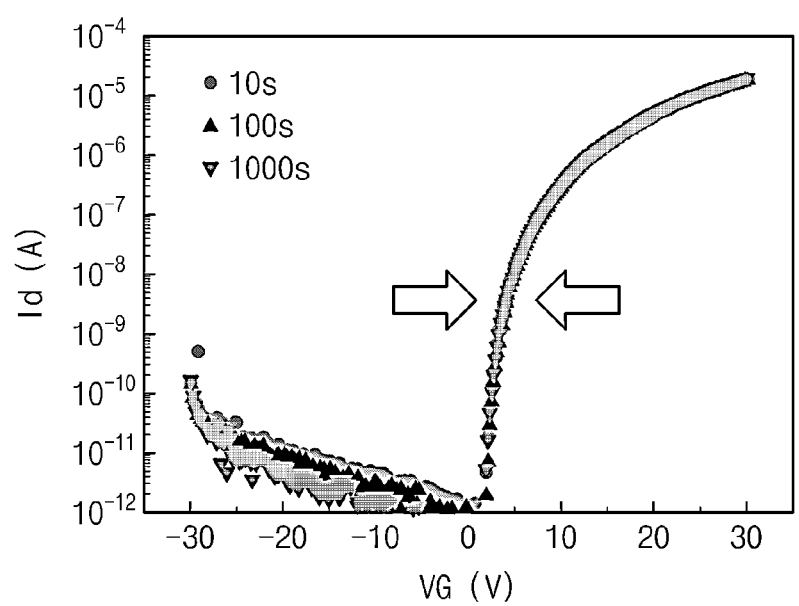
Figure 11:
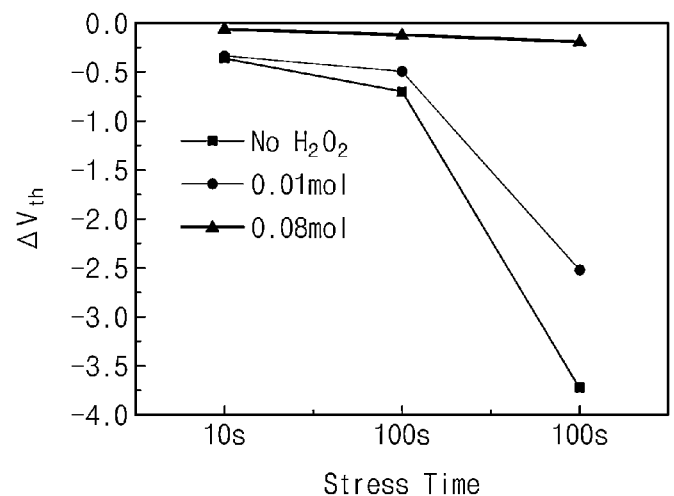
FIG. 11 is a graph showing a variation ($\Delta V_{th}$) in threshold voltage of a transistor fabricated without using hydrogen peroxide, a transistor fabricated by mixing 0.01 mole of hydrogen peroxide, and a transistor fabricated by mixing 0.08 mole of hydrogen peroxide, respectively.

FIGS. 8 through 10 are graphs showing voltage-current characteristics of a transistor fabricated without using hydrogen peroxide, a transistor fabricated by mixing 0.01 mole of hydrogen peroxide, and a transistor fabricated by mixing 0.08 mole of hydrogen peroxide, respectively, and FIG. 11 is a graph showing a variation ($\Delta V_{th}$) in threshold voltage of these transistors under an environment that a negative voltage continues to be applied.

Referring to FIGS. 8 through 10, compared with the transistor fabricated without using hydrogen peroxide, in the case of the transistors fabricated by mixing hydrogen peroxide, the threshold voltage variation (intervals between arrows in FIGS. 8 through 10) was remarkably reduced.

Particularly, referring to FIG. 11, in the case of the transistor fabricated by mixing 0.08 mole of hydrogen peroxide in the solution, the threshold voltage variation was close to zero, and it was confirmed from this result that the reliability was greatly improved.

As described above, it can be understood that the oxide thin film transistors fabricated using hydrogen peroxide according to embodiments of the present disclosure have highly improved electrical performances and reliability, compared with the transistor fabricated without using hydrogen peroxide.

In the embodiments of the present disclosure, the hydrogen peroxide added to the solution decreases defects in the thin film by three mechanisms.

The first mechanism is due to oxygen generated during decomposition of hydrogen peroxide. Oxygen atoms generated during decomposition of hydrogen peroxide may fill oxygen vacancy defects caused by loss of oxygen atoms in a lattice system showing a bonding structure between metal ions and oxygen ions, thus reducing the corresponding defects.

The second mechanism is due to strong oxidation potential of hydrogen peroxide. When metal atoms and oxygen atoms are not bonded to each other but exist in spaces between lattices, hydrogen peroxide having strong oxidation potential may oxidize or reduce these atoms to restore or volatize these oxidized or reduced ions.

The third mechanism is the most dominant mechanism of the present disclosure in which organic materials used as minor materials in the solution process are decomposed and removed. A solvent, a stabilizer, and a pH regulator which are used in the solution process are polymer organic compounds which are volatized at a temperature exceeding at least 150° C. Hydrogen peroxide has an ability to decompose such organic materials. Particularly, hydroxyl radicals which are generated during pyrolysis of hydrogen peroxide are an oxidant having the second strongest oxidation potential as listed in Table 1.

TABLE 1

| Oxidant | Oxidation Potential (V) |
|---|---|
| Fluorine | 3.0 |
| Hydroxyl radical | 2.8 |
| Ozone | 2.1 |
| Hydrogen peroxide | 1.8 |

TABLE 1-continued

| Oxidant | Oxidation Potential (V) |
|---|---|
| Potassium permanganate | 1.7 |
| Chlorine dioxide | 1.5 |
| Chlorine | 1.4 |

The hydroxyl radicals may decompose polymer organic compounds into low molecular volatile materials to remove the decomposed low molecular volatile materials at a temperature not higher than about 100° C. The organic compounds added in the solution process interact with materials in the thin film to be volatized at a temperature of 200° C. or higher which is much higher than the inherent volatile temperature thereof, thus damaging the lattice structure of the thin film and causing defects. However, when the thin film is formed by using the solution mixed with hydrogen peroxide, the organic compounds may be volatized at a temperature not higher than 100° C. to in advance prevent occurrence of defects in the thin film due to high temperature heat treatment.

Figure 12:
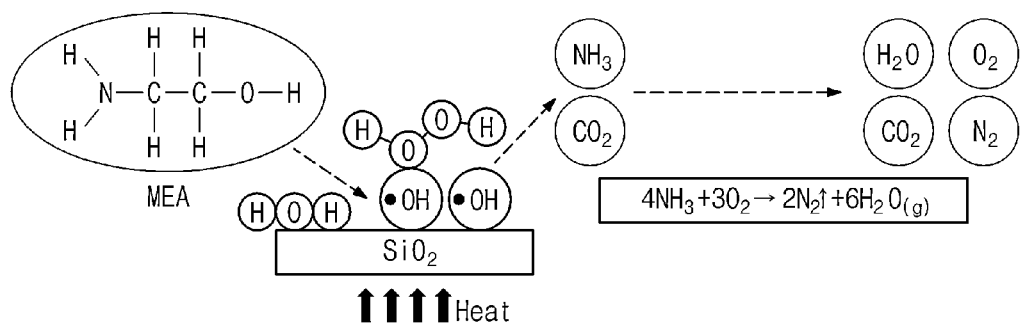
FIG. 12 is a schematic view illustrating that hydrogen peroxide added according to an embodiment of the present disclosure decomposes and removes a polymer organic compound, for example, monoethanolamine (MEA)

FIG. 12 is a schematic view illustrating that hydrogen peroxide added according to an embodiment of the present disclosure decomposes and removes a polymer organic compound, for example, monoethanolamine (MEA).

Monoethanolamine used as a stabilizer for preventing agglomeration and precipitation of the solution is a polymer organic compound which is a major factor to cause defects in the thin film. Hydrogen peroxide mixed in the solution generates hydroxyl radicals through pyrolysis to chemically decompose a polymer organic compound.

Referring to FIG. 12, monoethanolamine is decomposed into $NH_3$ and $CO_2$ that are low molecular materials by hydroxyl radicals generated from hydrogen peroxide through pyrolysis, and these low molecular materials may be again decomposed into $H_2O$, $O_2$, $CO_2$, and $N_2$ and removed.

Figure 13:
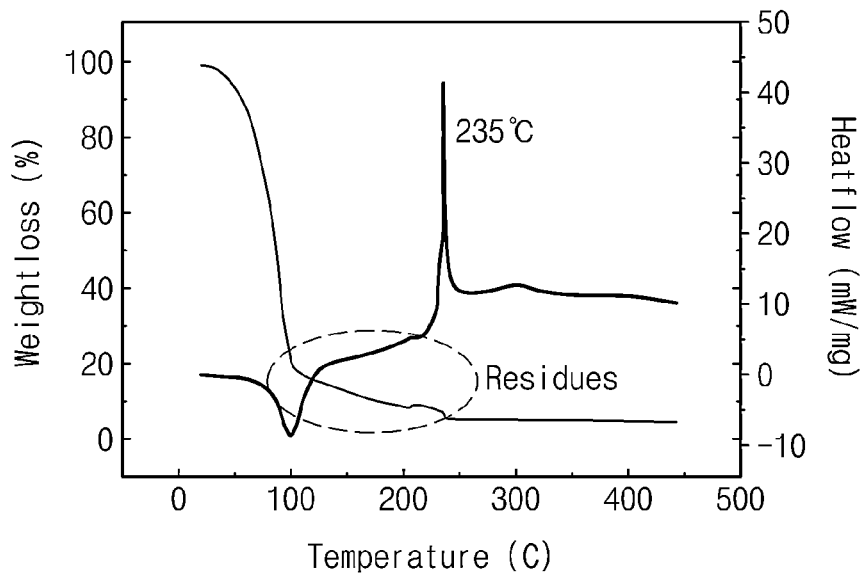
FIGS. 13 and 14 are graphs showing whether or not a polymer organic material remains with respect to a solution with which hydrogen peroxide is not mixed and a solution with which hydrogen peroxide is mixed, and a variation in solidification temperature, which have been analyzed through ThermoGravimetry-Differential Scanning calorimetery (DSC)
Figure 14:
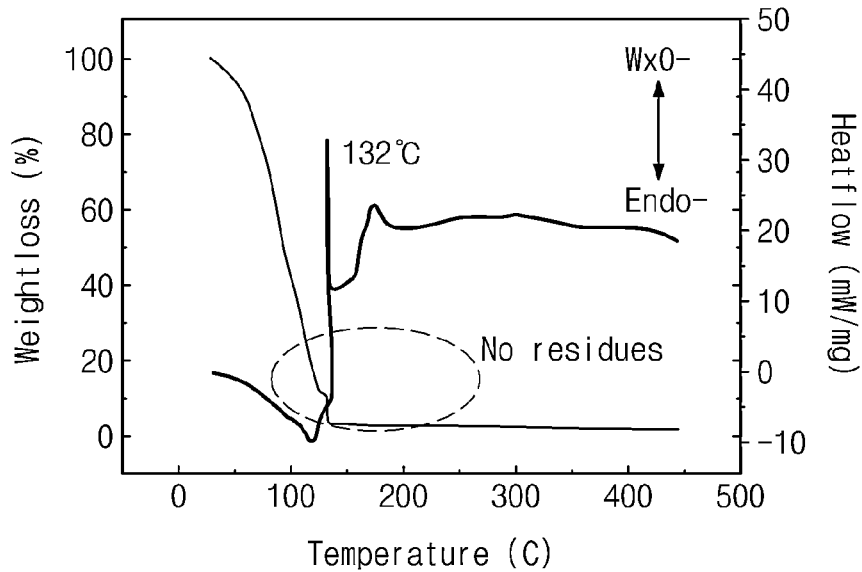

FIGS. 13 and 14 are graphs showing whether or not a polymer organic material remains with respect to a solution with which hydrogen peroxide is not mixed and a solution with which hydrogen peroxide is mixed, and a variation in solidification temperature, which have been analyzed through ThermoGravimetry-Differential Scanning calorimetery (DSC).

Referring to FIG. 13, it could be confirmed that in the solution in which hydrogen peroxide was not mixed, organic materials remained to 235° C. and thus densification temperature was high. On the other hand, referring to FIG. 14, it could be understood that in the solution in which hydrogen peroxide was mixed, organic materials were all decomposed at low temperatures and thus densification was achieved at about 132° C. The start of densification at a lower temperature means that defects, which are generated during volatilization of polymer organic materials, may be decreased.

As described above, according to an embodiment of the present disclosure, a stack type channel layer including a plurality of layers can be formed by using a precursor solution in which hydrogen peroxide is mixed.

FIGS. 15 through 17 show combinations of cross-sectional views and voltage-current characteristic graphs of an oxide thin film transistor having two channel layers formed by using a precursor solution in which hydrogen peroxide is not mixed, an oxide thin film transistor having a lowermost layer formed by using a precursor solution in which hydrogen peroxide is mixed, and an uppermost layer formed by using a precursor solution in which hydrogen peroxide is not mixed, and an oxide thin film transistor having two channel layers formed by using a precursor solution in which hydrogen peroxide is mixed.

Referring to FIG. 15, it could be understood that the oxide thin film transistor having a multi-layered structure which was fabricated without using hydrogen peroxide had a large variation in threshold voltage and thus was low in reliability, whereas as shown in FIGS. 16 and 17, the oxide thin film transistors having a multi-layered structure which were fabricated using hydrogen peroxide had a small variation in threshold and thus had higher reliability to a negative voltage stress than the oxide thin film transistor shown in FIG. 15.

While an embodiment in which a thin film is formed by a solution process using hydrogen peroxide has been described in the above, the hydrogen peroxide may be used in processes of forming a thin film by vacuum evaporation as well as the solution process.

Figure 18:
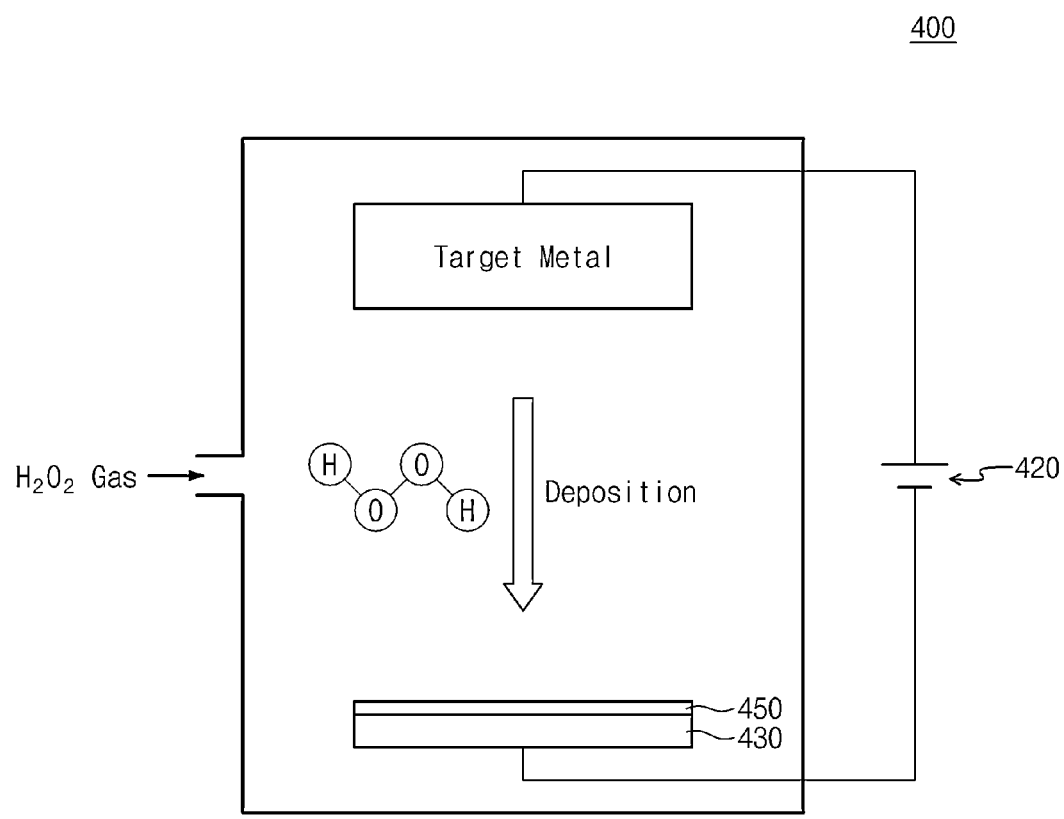
FIG. 18 is a view schematically illustrating an embodiment in which hydrogen peroxide is used for thin film deposition.

FIG. 18 is a view schematically illustrating an embodiment in which hydrogen peroxide is used for thin film deposition.

As shown in FIG. 18, a substrate treating apparatus 400 may include a chamber 410 for depositing a thin film 450 on a substrate 430. The chamber 410 is provided with a target metal 440 which is being used as a material for forming a thin film 450, and the target metal 440 and the substrate 430 may be connected to a DC power 420.

According to this embodiment, when the thin film 450 is deposited on the substrate 430 through vacuum evaporation, hydrogen peroxide may be supplied in a gas state to the inside of the chamber 410. The hydrogen peroxide supplied into the chamber 410 can decrease defects generated in the thin film 450 to improve the quality of the thin film.

In the above, methods of forming an oxide thin film on a substrate and methods of fabricating an oxide thin film transistor have been described. According to the methods of forming an oxide thin film on a substrate and the methods of fabricating an oxide thin film transistor, a high quality thin film having less defects can be obtained at low costs to thus improve the operation performances and reliability of devices.

According to embodiments of the present disclosure, defects generated in a thin film can be decreased and organic matters can be decomposed and removed at low temperatures to improve the quality of the thin film.

According to embodiments of the present disclosure, since a thin film with high quality can be obtained without introducing a high price equipment, electrical performances and operation reliabilities of oxide thin film transistors can be improved.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method of forming an oxide film, comprising:
   mixing hydrogen peroxide with a precursor solution in which a precursor material is dissolved in a solvent;
   applying the precursor solution mixed with the hydrogen peroxide to a substrate; and
   heat treating the substrate, wherein the precursor solution is prepared by dissolving indium nitrate hydrate, gallium nitrate hydrate, and zinc acetate dihydrate in 2-methoxyethanol.

2. The method of claim 1, wherein prior to mixing hydrogen peroxide with the precursor solution, further comprising adding to the precursor solution at least one selected from the group consisting of an acetic acid ($CH_3COOH$), a nitric acid ($HNO_3$), mono-ethanol amine, di-ethanolamine, tri-ethanol amine, acetylacetonate, ethylenediamine, tetramethlyethylendiamine, ethylene glycol ($C_2H_6O_2$), and glycerol ($C_3H_8O_3$).

3. The method of claim 1, wherein the mixing hydrogen peroxide with the precursor solution comprises mixing hydrogen peroxide and the precursor solution at a molar ratio of 1:0.1~1.

4. The method of claim 1, wherein the applying of the precursor solution mixed with hydrogen peroxide to a substrate comprises, before the hydrogen peroxide reacts with the precursor solution to form a precipitate, applying the precursor solution mixed with hydrogen peroxide to the substrate.

5. The method of claim 1, wherein the heat treating the substrate comprises heat treating the substrate at a first temperature and heat treating the substrate at a second temperature, the second temperature being higher than the first temperature.

6. The method of claim 5, wherein heat treating the substrate at a first temperature comprises heat treating the substrate at 100° C. for 30 minutes.

7. The method of claim 5, wherein heat treating the substrate at a second temperature comprises heat treating the substrate at 450° C. for 2 hours.

8. The method of claim 7, further comprising, prior to heat treating the substrate at 450° C. for 2 hours, heat treating the substrate at 300° C. for 5 minutes.

9. The method of claim 1, wherein the indium nitrate hydrate, the gallium nitrate hydrate and the zinc acetate dihydrate have a molar ratio of 5:1:2.

10. The method of claim 1, wherein the solvent and the precursor material have a molar ratio of 1:0.3.

11. A method of fabricating an oxide thin film transistor, comprising:
mixing hydrogen peroxide with a precursor solution in which a precursor material is dissolved in a solvent;
forming a channel layer by applying the precursor solution mixed with the hydrogen peroxide to a substrate provided with a gate and a gate insulating layer within a predetermined time, and heat treating the substrate ; and
forming a source and a drain in the substrate,
wherein the solution is prepared by dissolving indium nitrate hydrate, gallium nitrate hydrate, and zinc acetate dihydrate in 2-methoxvethanol.

12. The method of claim 11, wherein the indium nitrate hydrate, the gallium nitrate hydrate and the zinc acetate dihydrate have a molar ratio of 5:1:2.

13. The method of claim 11, wherein the solvent and the precursor material have a molar ratio of 1:0.3.

14. The method of claim 11, further comprising, prior to mixing hydrogen peroxide with the precursor solution, adding mono-ethanol amine and an acetic acid to the precursor solution.

15. The method of claim 11, wherein the forming a channel layer comprises applying the precursor solution mixed with the hydrogen peroxide to the substrate within one hour after the hydrogen peroxide is mixed to the precursor solution.

16. The method of claim 11, wherein the heating the substrate comprises:
heat treating the substrate at 100° C. for 30 minutes to activate the hydrogen peroxide;
heat treating the substrate at 300° C. for 5 minutes to change the precursor solution to a gel state after the activating of the hydrogen peroxide; and
heat treating the substrate at 450° C. for 2 hours.

17. The method of claim 11, wherein the forming a channel layer comprises:
(a) applying the precursor solution mixed with the hydrogen peroxide to the substrate;
(b) heat treating the substrate at 100° C. for 30 minutes to activate the hydrogen peroxide;
(c) heat treating the substrate at 300° C. for 5 minutes to change the precursor solution to a gel state;
(d) repeating (a)~(c); and
(e) heat treating the substrate at 450° C. for 2 hours.

18. The method of claim 11, further comprising forming a passivation layer on the channel layer.

* * * * *